United States Patent
Winand et al.

(10) Patent No.: US 6,485,615 B1
(45) Date of Patent: Nov. 26, 2002

(54) PROCESS OF DEPOSITING A COATING ONTO A SUBSTRATE BY REACTIVE SPUTTERING

(75) Inventors: René Winand, Rixensart (BE); Stéphane Lucas, Namur (BE); Pierre Vanden Brande, Brussels (BE); Alain Weymeersch, Wavre (BE); Lucien Renard, Seraing (BE)

(73) Assignee: Recherche et Development du Groupe Cockerill Sambre, Ougree (BE)

( * ) Notice: Subject to any disclaimer, the term of this patent is extended or adjusted under 35 U.S.C. 154(b) by 0 days.

(21) Appl. No.: 08/225,942

(22) Filed: Apr. 11, 1994

(30) Foreign Application Priority Data

Apr. 16, 1993 (BE) .......................................... 09300378

(51) Int. Cl.[7] .............................................. C23C 14/34
(52) U.S. Cl. ................................................ 204/192.12
(58) Field of Search ..................... 204/192.12, 298.07, 204/298.09

(56) References Cited

U.S. PATENT DOCUMENTS 4,704,199 A * 11/1987 Yokokawa et al. .... 204/298.03
4,894,132 A * 1/1990 Tanaka .............. 204/298.03 X
5,064,520 A * 11/1991 Miyake et al. ...... 204/298.04 X

FOREIGN PATENT DOCUMENTS

| EP | 0032788 | 7/1981 |
|----|---------|--------|
| EP | 0291044 | 11/1988 |
| EP | 0383301 | 8/1990 |

* cited by examiner

Primary Examiner—Rodney G. McDonald
(74) Attorney, Agent, or Firm—Browdy and Neimark, PLLC

(57) ABSTRACT

A process of depositing a coating (5) onto a substrate (3) by reactive sputtering in a closed chamber (1) in the presence of a plasma of a non-reactive gas, and a reactive gas containing the element or elements said coating has to be made of, according to which process use is made of a target (2) having a surface layer (4) directed towards the substrate and containing at least one of the elements to be sputter deposited onto this substrate, according to which process the thickness of said surface layer (4) during the cathode sputtering is controlled by adjusting the concentration of the gases in said closed chamber (1). The single figure.

20 Claims, 1 Drawing Sheet

PROCESS OF DEPOSITING A COATING ONTO A SUBSTRATE BY REACTIVE SPUTTERING

Figure 1:
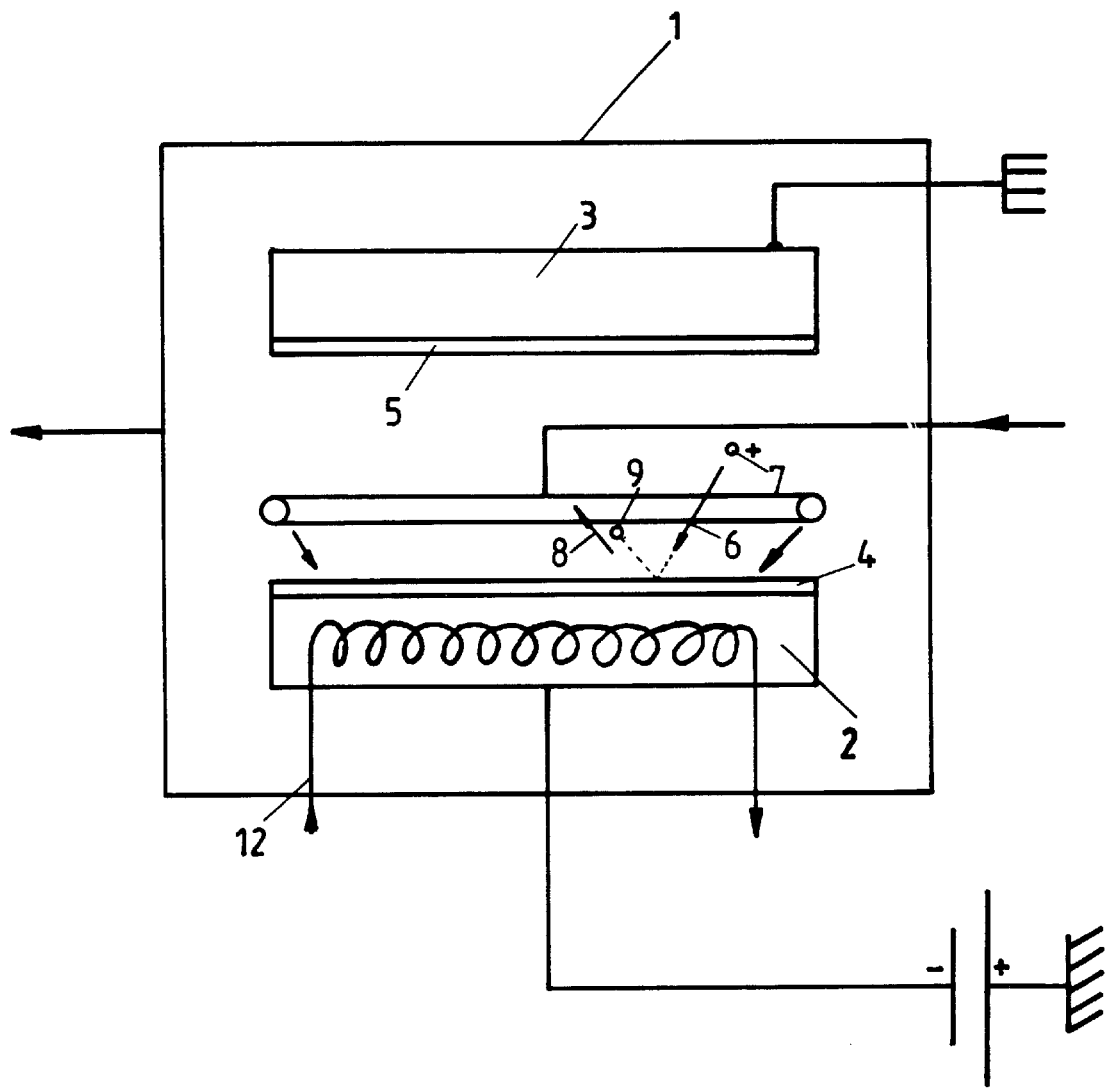

The present invention relates to a process of depositing a coating onto a substrate by reactive sputtering in a closed chamber in the presence of a plasma of a non-reactive gas, such as argon, and a reactive gas containing the elements said coating is to be made of, according to which process use is made of a target having a surface layer directed towards the substrate and containing at least one of the elements to be sputter deposited onto this substrate, said sputtering being effected under conditions such as to enable this element from the reactive gas to be deposited onto the target to form said surface layer and to be ejected therefrom by the action of ionized gas so as to be deposited subsequently onto the substrate.

In the known processes of the hereabove mentioned type, the target has to be changed regularly due to the fact that said surface layer thereof is consumed during the cathode sputtering.

To this end, the installation has to be stopped completely for removing the target and installing a new target.

Usually this involves a relatively encumbering operation requiring skilled labor therefore rendering it relatively expensive. Moreover, replacing a used target by a new target may affect the homogeneity and the quality of the coating deposited onto the substrate.

Such a process has more particularly been described in an article of L. M. Briggs, D. R. Mc Kenzie and R. C. Mc Phedran "Optical constants and microstructure of stainless steel carbon films prepared by reactive magnetron sputtering" Solar Energy Materials 6 (1982) 455/466.

One of the essential objects of the invention is to overcome the drawbacks of the existing processes in a relatively simple and economically feasible way.

According to the invention, the thickness of said surface layer during the cathode sputtering is controlled hereto by adjusting the concentration of the gases in the closed chambers.

Advantageously, the thickness of the surface layer of the target during the cathode sputtering is controlled by adjusting the mutual ratio of the flow rate of non-reactive and reactive gas in said chamber.

Other details and particularities of the invention will become apparent from the following description given hereinafter by way of non-limiting examples of some particular embodiments of the invention with reference to the annexed schematic drawing showing an installation suited for carrying out the process according to the invention.

The process of depositing a coating onto a substrate by cathode sputtering is performed under vacuum in a closed chamber 1 having a target 2 mounted therein and a substrate 3 disposed opposite the target at a certain distance therefrom. The target 2 comprises a surface layer 4 directed towards the side of the substrate 3 onto which a coating 5 is to be deposited. This surface layer 4 contains at least one of the elements from which the coating 5 is to be made of and which are to be deposited onto the substrate 3 by cathode sputtering.

The chamber 1 contains plasma of a non-reactive gas, such as argon, and of a reactive gas comprising said element or elements.

In a cathode sputtering process, the atoms are ejected from the surface of the surface layer 4 and are deposited as a coating 5 onto the substrate 3.

A negative voltage is applied to the target 2 and consequently to the material of the surface layer 4 to be ejected. As a result thereof, a discharge is generated which creates said plasma made up of ions, electrons and neutral gas particles.

Positively charged ions are accelerated in this way to the negatively charged target striking it with sufficient energy to cause the ejection of atoms from the surface layer 4. These atoms travel to the substrate 3 and are deposited thereon as a substantially uniform and reproducible coating with a good adhesion to the surface of the substrate 3.

In the annexed figure, arrow 6 shows schematically the displacement of a positive ion 7 from the plasma towards the target while arrow 8 shows schematically the ejection of an atom 9 towards the substrate.

The cathode sputtering is effected under such conditions that this or these element(s) of the reactive gas may be deposited onto the target 2 so as to form the surface layer 4 and so as to be ejected from this layer under the action of the ionized gas, the positive ions of which strike this layer, to be deposited subsequently onto the substrate 3.

According to the invention, the thickness of the surface layer 4 on the target during the cathode sputtering is controlled by adjusting the concentration of the gases in the closed chamber 1.

As already indicated hereinabove, a non-reactive gas allowing to establish the plasma and a reactive gas containing the element or elements, from which the coating 5 is to be made of are introduced into the chamber 1.

More particularly, the reactive gas can either react with the atoms 9 extracted from the target 1 by sputtering or can form free radicals by ionization-decomposition so as to deposit onto the substrate 3 chemical compounds containing atoms from the target 2 and other atoms from the reactive gas.

In this case, the surface layer 4 on the target is automatically achieved on the basis of atoms from said reactive gas.

The invention relates to the idea to benefit from this observation and to create, by choosing the kind of reactive gas, a surface layer 4 permitting to form the coating 5 onto the substrate 3 by means of the known cathode sputtering technique.

According to the invention, use is made of a reactive gas which contains all of the necessary atoms for forming the coating 5 onto the substrate 3 and the cathode sputtering parameters are adjusted such that at least a portion of these atoms may be deposited onto the target to form said surface layer 4 and to be ejected therefrom under the action of the ionized gas to be deposited subsequently onto the substrate 3.

Advantageously, in order to avoid consuming the target, the process parameters are chosen such that the target is sputtered substantially at the same rate as the rate at which said surface layer 4 is formed.

Thus, according to a particular embodiment of the invention, the conditions for establishing the plasma are kept substantially constant. Moreover, the proportion of reactive gas in the gaseous mixture introduced into the chamber 1 is chosen and kept at a constant value.

According to the invention it has been found that, in order to ameliorate the formation of the surface layer 4 onto the target 2, it is useful to direct the reactive gas towards the plasma and especially towards the target 2.

According to a particular embodiment, the reactive gas is fed into the chamber 1 by means of a shower 10, the ejectors of which are directed towards the target 2 as indicated in the figure by arrows 11.

Thanks to the process according to the invention, it is possible to deposit a coating 5 onto the substrate formed by a hydrocarbon film by means of a target with a self-supply of carbon by a hydrocarbon gas.

It is also possible to deposit other coatings (metals, non-metals, defined compounds, solid solutions and compounds out of equilibrium) by feeding the chamber 1 with appropriate reactive gases.

To the target 2 a direct or alternating current may be applied. Moreover, a magnetic field perpendicular to the electric field may be created by means of a permanent magnet or an electromagnet, not shown in the figure, in order to increase to ionization of the plasma gases.

The distance between the target 2 and the substrate 3 is generally in the range of some cm, depending on the other process parameters such as the size of the chamber, the flow rate of the gases, the electrical current voltage, etc . . . .

Furthermore, the target is advantageously cooled. This has been shown schematically in the figure by the spiral duct 12 incorporated into the target 2 and through which cooling water may for example be circulated.

Generally, the pressure within the chamber 1 is adjusted between 1 and $10^{-5}$ torr, preferably between 0.1 and $10^{-4}$ torr.

The plasma may be established by a magnetic field effect direct electric current, the current density of which at the target is comprised between $10^{-3}$ and 1 $Acm^{-2}$, preferably between $10^{-3}$ and 0.03 $Acm^{-2}$.

In order to be able to deposit a hydrocarbon coating 5, use is made of a reactive gas primarily composed of acetylene whereas the non-reactive gas is advantageously composed of argon.

In such a case, the respective flow rates of these two gases is advantageously adjusted to achieve a volume ratio of reactive gas/non-reactive gas within the chamber 1 comprised between 1 and $10^{-3}$, preferably between $10^{-1}$ and $10^{-2}$.

The thickness of the surface layer 4 on the target 2 may be controlled by means which are known such as by an analysis of the composition of the gases within the chamber 1, by optical emission spectrometry or by mass spectrometry.

To this end, use is advantageously made of a target 2 whose surface, onto which the surface layer 4 is formed, contains innocuous elements for the coating to be deposited onto the substrate and which do not disturb the good working of the cathode sputtering. Thus, at the moment the surface layer is nearly consumed, such elements could be ejected from the target and could therefore by present in the gases contained in the chamber. As soon as the presence of such elements is observed, only the flow rate of reactive gas has to be increased. In this way, a periodic variation of the thickness of the surface layer 4 on the target 2 is obtained.

However, according to a preferred embodiment of the invention, the flow rate and the ratio of gases is adjusted in a manner such as to keep the thickness of the surface layer substantially constant during the entire cathode sputtering operation.

Hereinafter, two concrete examples of depositing a coating onto a substrate by the reactive sputtering process according to the invention are given.

EXAMPLE 1

This example relates to the formation of a carbon based coating 5. The employed reactive gas was composed of acetylene whereas the non-reactive gas was composed of argon.

The employed installation was based only on magnetic field effect direct current (magnetron d.c.)

The pressure of the gases within the chamber was $5 \times 10^{-3}$ torr, while the electric current density on the target was 10 $mAcm^{-2}$.

The respective flow rates of the two gases was adjusted so as to obtain a volume content of acetylene=7 and a volume content of argon=93.

Carbon was deposited onto the target at the same rate as it was sputtered and contained about 10% hydrogen.

The deposit achieved onto the substrate was formed of a polymer with a C/H ratio=1.

The plasma observed by optical emission spectrometry was composed of Ar, $Ar^+$, C, $C_2$, H, $CH^+$ and CH.

EXAMPLE 2

In this example the coating is formed of aluminium.

The employed non-reactive gas was argon, while the reactive gas was formed of trimethyl aluminium. The same equipment was used as in example 1.

The gas was maintained within the chamber at a pressure of $5.10^{-3}$ torr while the current density on the target was 15 $mAcm^{-2}$.

The gaseous mixture contained 25 volume % of trimethyl aluminium and 75 volume % of argon.

The surface layer 4 on the target 2 contained primarily aluminium. The coating on the substrate was composed of an aluminium film of a high purity.

What is claimed is:

1. A process of depositing a coating onto a substrate by reactive sputtering in a closed chamber in the presence of a plasma of a non-reactive gas, and a reactive gas containing the element or elements said coating is to be made of, according to which process use is made of a target having a surface layer directed towards said substrate and containing at least one of said elements, to be sputter deposited, as reactive gas to either react with atoms extracted from the target by sputtering or form free radicals by ionization-decomposition to be deposited onto the target for forming said surface layer and to be ejected therefrom by the action of ionized gas so as to be deposited subsequently onto said substrate, the thickness of said surface layer during the cathode sputtering being controlled by adjusting the concentration of said non-reactive gas and said reactive gas in said closed chamber, so as to avoid consuming the target.

2. The process according to claim 1, wherein said reactive gas and said non-reactive gas are introduced at respective flow rates into said chamber and wherein the thickness of the surface layer of the target during the cathode sputtering is controlled by adjusting the mutual ratio of said respective flow rates.

3. The process according to claim 2, wherein said sputtering is alternating current cathode sputtering, direct current cathode sputtering or both alternating and direct current cathode sputtering.

4. The process according to claim 1, wherein said reactive gas contains acetylene, trimethyl aluminium, or both acetylene and trimethyl aluminium.

5. The process according to claim 1, wherein said plasma is established by a magnetic field effect direct electric current, the density of which on said target is between $10^{-3}$ $Acm^{-2}$ and 1 $Acm^{-2}$.

6. The process according to claim 1, wherein said non-reactive gas is argon and said reactive gas is acetylene, and said argon and said acetylene are introduced into said chamber at respective flow rates adjusted to achieve a volume ratio within said chamber of between 1 and $10^{-3}$.

7. The process according to claim 6, wherein said respective flow rates are adjusted to achieve a volume ratio within said chamber comprised between $10^{-1}$ and $10^{-2}$.

8. The process according to claim 1, wherein the thickness of said surface layer is controlled by an analysis of the composition of the gases within said closed chamber.

9. The process according to claim 1, wherein the pressure within said chamber is adjusted between 1 torr and $10^{-5}$ torr.

10. The process according to claim 9, wherein said pressure within the chamber is adjusted between 0.1 and $10^{-4}$ torr.

11. A process of depositing a coating onto a substrate by reactive sputtering in a closed chamber in the presence of a plasma of a non-reactive gas, and a reactive gas containing the element or elements said coating is to be made of, according to which process use is made of a target having a surface layer directed towards said substrate and containing at least one of said elements, to be sputter deposited, as reactive gas to either react with atoms extracted from the target by sputtering or form free radicals by ionization-decomposition to be deposited onto the target for forming said surface layer and to be ejected therefrom by the action of ionized gas so as to be deposited subsequently onto said substrate, the thickness of said surface layer during the cathode sputtering being controlled by adjusting the concentration of said non-reactive gas and said reactive gas in said closed chamber, the process parameters being chosen such that the target is sputtered substantially at the same rate as the rate at which said surface layer is formed so as to avoid consuming the target.

12. A process of depositing a coating onto a substrate by reactive sputtering, comprising the steps of:

introducing a non-reactive gas and a reactive gas containing at least one element of said coating into a closed chamber;

establishing a plasma of said non-reactive gas;

directing said reactive gas towards said plasma and a target, said target having a surface layer directed towards said substrate;

either a) reacting said reactive gas with atoms extracted from said target by sputtering, or b) forming free radicals by ionization/decomposition for depositing said surface layer onto said target and then ejecting atoms from said surface layer by action of ionized gas;

depositing said coating onto said substrate as a substantially uniform and reproducible coating with good adhesion to a surface of said substrate; and controlling the thickness of said surface layer during sputtering by repeatedly adjusting the concentration of said non-reactive gas and said reactive gas in said closed chamber, whereby said target is sputtered substantially at the same rate as the rate at which said surface layer is formed so as to avoid consuming said target.

13. A process of depositing a coating onto a substrate by reactive sputtering in a closed chamber under vacuum, comprising the steps of:

introducing a concentration of a non-reactive gas and a concentration of a reactive gas containing at least one element of said coating into said closed chamber at respective flow rates;

subsequently establishing a plasma of said non-reactive gas and said reactive gas within said closed chamber;

depositing free radicals formed from said reactive gas as a surface layer onto a target, said free radicals containing at least one element of said coating;

ejecting said at least one element from said target surface layer by the sputtering action of ions striking said target surface layer with sufficient energy, said ejected at least one element being capable of reacting with said reactive gas;

depositing said ejected at least one element onto said substrate as a substantially uniform and reproducible coating with good adhesion to a surface of said substrate; and controlling the thickness of said target surface layer during sputtering by adjusting said concentration of said non-reactive gas and said concentration of said reactive gas in said closed chamber to avoid consuming said target and thereby allow for reactive sputtering without the need for replacing said target.

14. The process according to claim 13, wherein said reactive gas contains acetylene, trimethyl aluminum, or both acetylene and trimethyl aluminum.

15. The process according to claim 13, wherein said reactive gas is acetylene and said non-reactive gas is argon.

16. The process according to claim 15, wherein said respective flow rates of said non-reactive and reactive gases being introduced into said closed chamber are adjusted to achieve a volume ratio of reactive gas to non-reactive gas between 1 and $10^{-3}$ within said closed chamber.

17. The process according to claim 13, wherein the closed chamber under vacuum is in the pressure range of about 1 torr to $10^{-5}$ torr.

18. The process according to claim 13, wherein the reactive sputtering is alternating current cathode sputtering, direct current cathode sputtering, or both alternating and direct current cathode sputtering.

19. The process according to claim 13, wherein said plasma is established by a magnetic field effect direct electric current, the density of which on said target is comprised between $10^{-3}$ $Acm^{-2}$ and 1 $Acm^{-2}$.

20. The process according to claim 19, wherein a direct electric current is applied, the density of which on the target is of $10^{-3}$ $Acm^{-2}$ to 0.03 Acm.

* * * * *